United States Patent
Reynaud et al.

(10) Patent No.: US 9,698,063 B2
(45) Date of Patent: Jul. 4, 2017

(54) METHOD OF TESTING A SEMICONDUCTOR-ON-INSULATOR STRUCTURE AND APPLICATION OF SAID TEST TO THE FABRICATION OF SUCH A STRUCTURE

(71) Applicant: Soitec, Crolles (FR)

(72) Inventors: Patrick Reynaud, Murianette (FR); Walter Schwarzenbach, Saint Nazaire les Eymes (FR); Konstantin Bourdelle, Crolles (FR); Jean-Francois Gilbert, Saint-Hilaire-du-Touvet (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/381,537

(22) PCT Filed: Feb. 18, 2013

(86) PCT No.: PCT/IB2013/000216
§ 371 (c)(1),
(2) Date: Aug. 27, 2014

(87) PCT Pub. No.: WO2013/132301
PCT Pub. Date: Sep. 12, 2013

(65) Prior Publication Data
US 2015/0014822 A1 Jan. 15, 2015

(30) Foreign Application Priority Data
Mar. 5, 2012 (FR) .................................... 12 51991

(51) Int. Cl.
*H01L 21/66* (2006.01)
*G01R 31/26* (2014.01)
(52) U.S. Cl.
CPC .......... *H01L 22/14* (2013.01); *G01R 31/2601* (2013.01); *H01L 22/20* (2013.01)

(58) Field of Classification Search
CPC ... H01L 21/67242; H01L 22/20; G01R 31/36; G01R 31/3606; G01R 31/3634; G01R 31/2601
(Continued)

(56) References Cited

U.S. PATENT DOCUMENTS 8,617,962 B2    12/2013  Schwarzenbach et al.
2003/0094708 A1*  5/2003  Itou .............................. 257/916
(Continued)

FOREIGN PATENT DOCUMENTS

JP    2007311672 A    11/2007
JP    2010062452 A     3/2010

OTHER PUBLICATIONS

Seo et al (Charge-to-Breakdown Characteristics of Thin Gate Oxide and Buried Oxide on SIMOX SOI Wafers, Journal of the Electrochemical Society, vol. 144, No. 1, 1997, pp. 375-378).*
(Continued)

*Primary Examiner* — Julio J Maldonado
*Assistant Examiner* — Hajar Kolahdouzan
(74) *Attorney, Agent, or Firm* — TraskBritt

(57) ABSTRACT

The invention concerns a method of testing a semiconductor-on-insulator type structure comprising a support substrate, a dielectric layer having a thickness of less than 50 nm and a semiconductor layer, the structure comprising a bonding interface between the dielectric layer and the support substrate or the semiconductor layer or inside the dielectric layer, characterized in that it comprises measuring the charge to breakdown ($Q_{BD}$) of the dielectric layer and in that information is deduced from the measurement relating to the hydrogen concentration in the layer and/or at the bonding interface. The invention also concerns a method of fabricat-
(Continued)

ing a batch of semiconductor-on-insulator type structures including carrying out the test on a sample structure from the batch.

18 Claims, 5 Drawing Sheets

(58) Field of Classification Search
USPC .................. 257/E21.521; 438/14; 324/762.01
See application file for complete search history.

(56) References Cited

U.S. PATENT DOCUMENTS

| | | | |
|---|---|---|---|
| 2004/0042307 A1* | 3/2004 | Ohmi et al. .................. | 365/212 |
| 2006/0148208 A1 | 7/2006 | Popov | |
| 2007/0216042 A1 | 9/2007 | Delprat et al. | |
| 2007/0231932 A1 | 10/2007 | Reynaud et al. | |
| 2010/0062588 A1 | 3/2010 | Murakami | |
| 2013/0045583 A1 | 2/2013 | Reynaud et al. | |

OTHER PUBLICATIONS

Andrieu et al, Low Leakage and Low Variability Ultra-Thin Body and Buried Oxide (UT2B) SOI Technology for 20nm Low Power CMOS and Beyond, 2010 Symposium on VLSI Tech. Proc, vol. 57, (2010), pp. 57-58.

Antonova et al., Electrical Conductivity of Silicon-on-Insulator Structures Prepared by Bonding Silicon Wafers to a Substrate Using Hydrogen Implantations, Semiconductors, American Institute of Physics, vol. 34, No. 9, Sep. 2000, pp. 1054-1057.

Holland et al, On Physical Models for Gate Oxide Breakdown, IEEE Electron Device Letters, vol. 5, No. 8, Aug. 1984, pp. 302-305.

International Search Report for International Application No. PCT/IB2013/000216 dated Jun. 14, 2013, 4 pages.

Ishigaki et al., Effects of Device Structure and Back Biasing on HCI and NBTI in Silicon-on-Thin-Box (SOTB) CMOSFET, IEEE Transactions on Electron Devices, vol. 58, No. 4, Apr. 2011, pp. 1197-1204.

Meyer et al., Model for Oxide Wearout Due to Charge Trapping, Proc. Int. Reliability Physics Symposium, (1983), pp. 242-247.

Rai-Choudhury et al., SOI Material Properties Determined by Electrical Characterization, Microelectronic Engineering, vol. 19, No. 1-4, Sep. 1992, pp. 827-832.

Seo et al., Charge-to-Breakdown Characteristics of Thin Gate Oxide and Buried Oxide on SIMOX SOI Wafers, Journal of the Electrochemical Society, vol. 144, No. 1, 1997, pp. 375-378.

Tsuchiya et al., Controllable Inverter Delay and Suppressing Vth Fluctuation Technology in Silicon on Thin Box Featuring Dual Back-Gate Bias Architecture, IEDM Proc, 2007, pp. 475-478.

International Written Opinion for International Application No. PCT/IB2013/000216 dated Jun. 14, 2013, 6 pages.

International Preliminary Report on Patentability for International Application No. PCT/IB2013/000216 dated Sep. 9, 2014, 7 pages.

Chinese First Notification of Office Action and Search Report for Chinese Application No. 201380012990.4 dated Apr. 8, 2016, 13 pages.

Japanese Office Action for Japanese Application No. 2014-560450 dated Sep. 13, 2016, 10 pages.

* cited by examiner

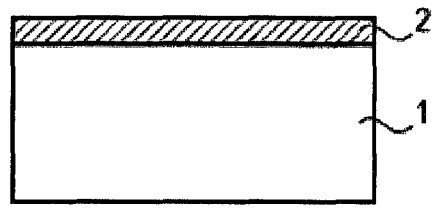
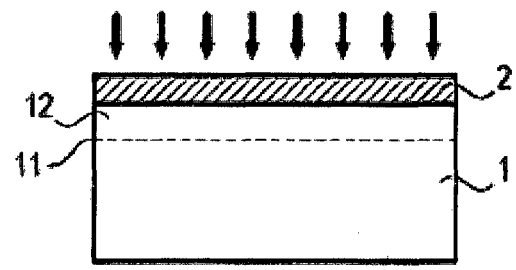
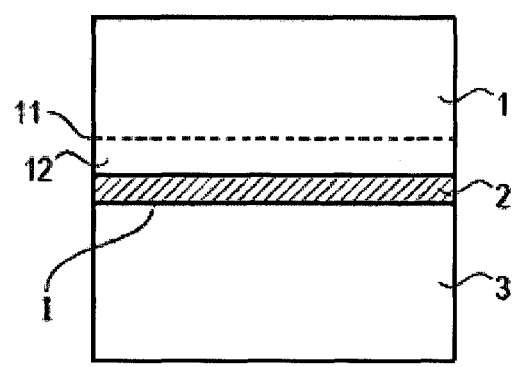
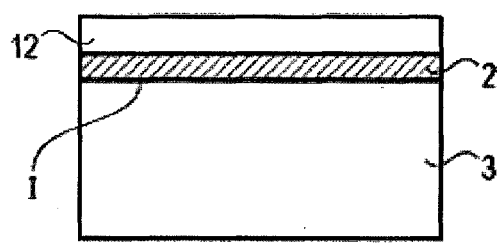

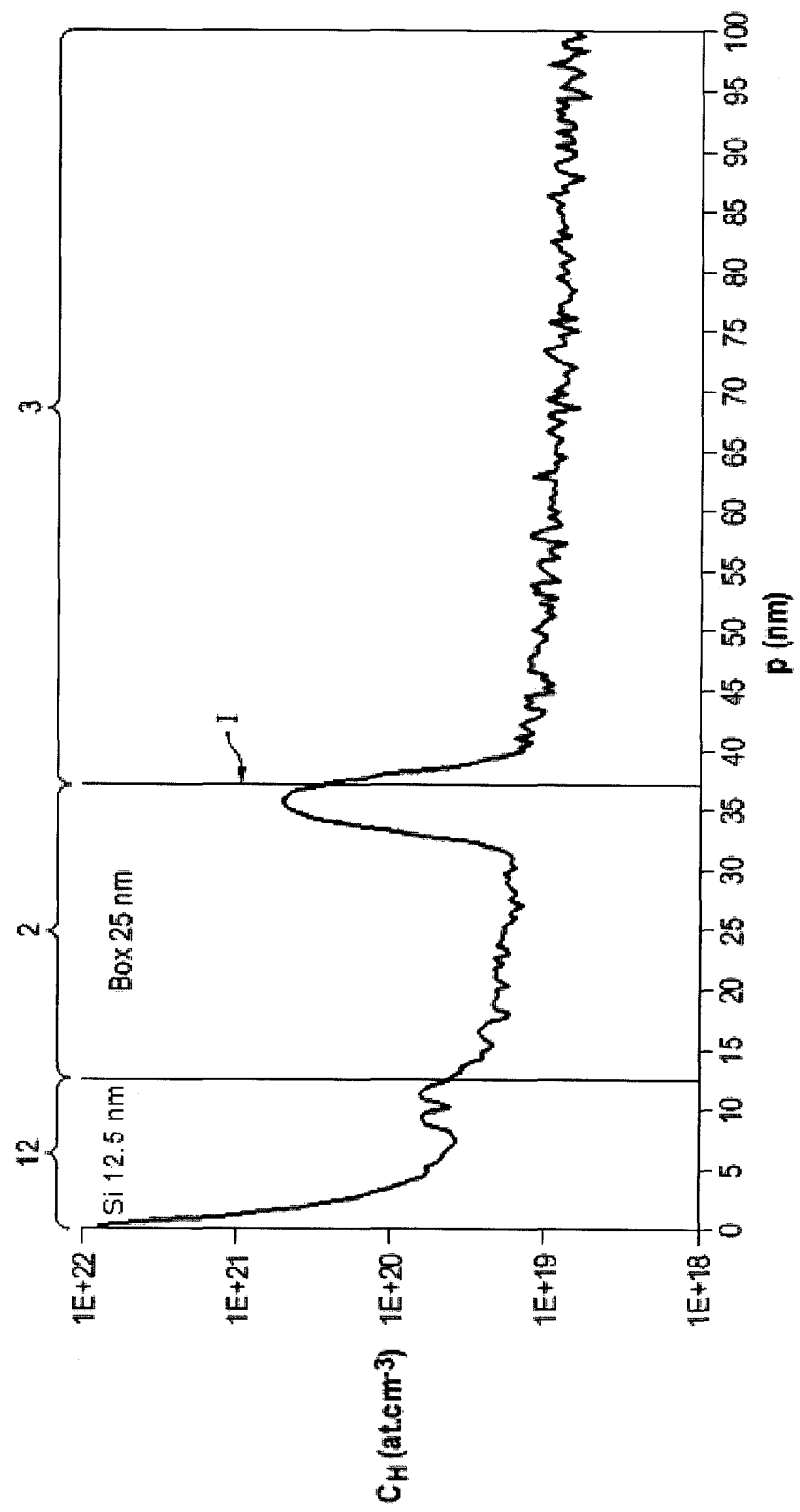

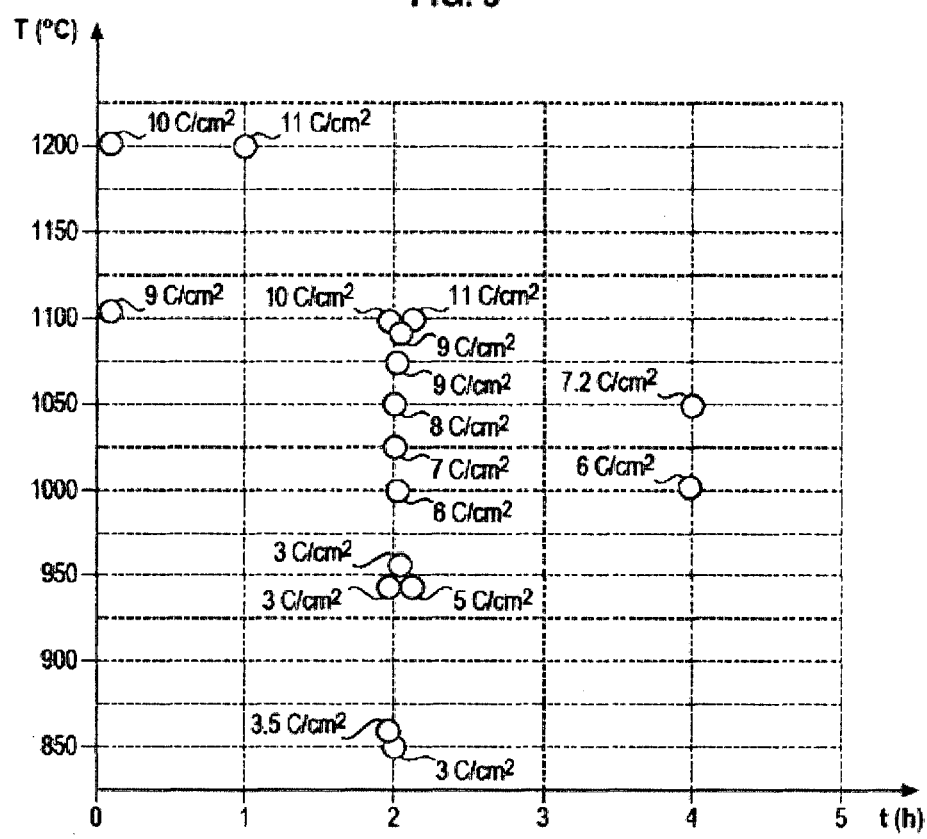

METHOD OF TESTING A SEMICONDUCTOR-ON-INSULATOR STRUCTURE AND APPLICATION OF SAID TEST TO THE FABRICATION OF SUCH A STRUCTURE

CROSS-REFERENCE TO RELATED APPLICATIONS

This application is a national phase entry under 35 U.S.C. §371 of International Patent Application PCT/IB2013/000216, filed Feb. 18, 2013, designating the United States of America and published in English as International Patent Publication WO 2013/132301 A1 on Sep. 12, 2013, which claims the benefit under Article 8 of the Patent Cooperation Treaty to France Application Serial No. 1251991, filed Mar. 5, 2012, the disclosure of each of which is hereby incorporated herein in its entirety by this reference.

FIELD OF THE INVENTION

The present invention concerns a method of testing and a method of fabricating a semiconductor-on-insulator type structure comprising successively from its base to its surface a support substrate, a dielectric layer having a thickness of less than 50 nm and a semiconductor layer.

BACKGROUND OF THE INVENTION

In semiconductor-on-insulator (SeOI) type structures, a buried dielectric layer electrically insulates the semiconductor layer from the support substrate.

If the material of the dielectric layer is silicon dioxide ($SiO_2$), the buried dielectric layer is generally designated by the acronym BOX derived from the expression Buried OXide.

In partially depleted (PD) SeOI structures, the thickness of the buried dielectric layer is generally greater than 100 nm and is, therefore, sufficient to ensure the electrical integrity and the quality of the layer.

On the other hand, in fully depleted (FD) SeOI structures, the semiconductor layer and the buried dielectric layer have an ultrathin thickness, i.e., less than 50 nm, possibly as little as around 5 nm.

Such structures are notably intended for the fabrication of transistors, the channel layer being formed in or on the ultrathin semiconductor layer, which is not doped.

Thanks to the ultrathin thickness of the buried dielectric layer and the semiconductor layer, these structures have the advantage of enabling precise control of the channel of the transistor, improving the short channel effect and reducing the variability of the transistor.

The properties of these transistors enable significant reduction of the length of the gate.

Moreover, the ultrathin buried dielectric layer provides improved electrostatic control and the possibility of applying a voltage to the rear face, by means of an electrode arranged on the face of the support substrate opposite the semiconductor layer, for controlling the threshold voltage or adjusting the power/performance trade-off.

In this regard reference may be made to the publications of R. Tsuchiya et al. IEDM Proc., 2007, p. 475 and F. Andrieu et al. VLSI Tech. Proc., 57, 2010.

To be able to apply a voltage to the rear face effectively, the thickness of the buried dielectric layer must be less than 50 nm and preferably 25 nm for transistors based on the fully depleted technology with a size of 28 nm.

Even thinner dielectric layers (down to 5 nm) are expected for future transistor sizes.

However, the very thin buried dielectric layer, which has to withstand a voltage applied to the rear face of the order of a few volts, raises the question of its electrical reliability.

This problem is addressed in the paper by Ishigaki et al. IEEE Trans. Electron. Devices, 58(4), p. 1197, 2011.

An object of the present invention is, thus, to define a method for measuring the electrical quality of the buried dielectric layer with a view to its application in the Fully Depleted technology.

Another object of the invention is to design a method enabling improvement of the electrical properties of the dielectric layer of a semiconductor-on-insulator structure intended to be used in the Fully Deleted technology.

BRIEF SUMMARY

In accordance with the invention, there is proposed a method of testing a semiconductor-on-insulator type structure comprising successively from its base to its surface a support substrate, a dielectric layer having a thickness of less than 50 nm and a semiconductor layer, the structure comprising a bonding interface between the support substrate and the dielectric layer or between the dielectric layer and the semiconductor layer or inside the dielectric layer.

The method is characterized in that it comprises measuring the charge to breakdown $Q_{BD}$ of the dielectric layer, and in that information is deduced from the measurement relating to the hydrogen concentration in the layer and/or at the bonding interface.

For measuring the charge to breakdown, at least one capacitor is formed on the semiconductor-on-insulator structure, the formation of the at least one capacitor comprising the deposition of a gate electrode on the semiconductor layer and the formation of trenches through the dielectric layer around the gate, and the charge to breakdown is measured for each capacitor.

Another object of the invention concerns a method of determining the temperature and the duration of a heat treatment to be applied to a semiconductor-on-insulator type structure comprising successively, from its base to its surface, a support substrate, a dielectric layer having a thickness of less than 50 nm and a semiconductor layer, the fabrication method comprising the following steps:

(a) procuring a donor substrate comprising the semiconductor layer, (b) forming the dielectric layer on the surface of the semiconductor layer of the donor substrate and/or on the surface of the support substrate, (c) bonding the donor substrate to the support substrate, the dielectric layer being at the bonding interface, (d) transferring the semiconductor layer from the donor substrate to the support substrate, so as to form the semiconductor-on-insulator structure, (e) applying to the structure a heat treatment at a temperature between 1000° C. and 1250° C. for a duration between 3 minutes and 100 hours to evacuate hydrogen atoms from the dielectric layer and/or the bonding interface.

The method is characterized in that the structure is fabricated in accordance with steps (a) to (d), in that the test method as defined above is carried out on the structure, and in that the duration and the temperature of the heat treatment of step (e) are chosen as a function of the measured charge to breakdown so as to obtain after the heat treatment a charge to breakdown greater than or equal to a predetermined threshold.

Another object of the invention concerns a method of fabricating a batch of semiconductor-on-insulator type structures, each structure comprising successively from its base to its surface a support substrate, a dielectric layer having a thickness of less than 50 nm and a semiconductor layer, characterized in that it comprises the following steps:

procuring a donor substrate comprising the semiconductor layer, forming the dielectric layer on the surface of the semiconductor layer of the donor substrate and/or on the surface of the support substrate, bonding the donor substrate to the support substrate, the dielectric layer being at the bonding interface, transferring the semiconductor layer from the donor substrate to the support substrate so as to form the semiconductor-on-insulator structure, applying to the structure a heat treatment at a temperature between 1000° C. and 1250° C. for a duration between 3 minutes and 100 hours to evacuate hydrogen atoms from the dielectric layer and/or from the bonding interface, sampling a structure from the batch and carrying out on the structure the test method as defined above to check that the charge to breakdown of the structure is greater than or equal to a predetermined threshold.

The predetermined threshold charge to breakdown may be 10 C/cm$^2$, for example.

The thickness of the semiconductor layer is preferably between 1 nm and 30 nm.

Moreover, the thickness of the dielectric layer is preferably between 3 nm and 50 nm, preferably between 10 nm and 30 nm.

The material of the semiconductor layer is advantageously chosen from silicon, strained silicon (sSi), silicon-germanium (SiGe), strained silicon-germanium (sSiGe), germanium, strained germanium (sGe) and semiconductors from groups III-V.

The dielectric layer may comprise a layer of silicon dioxide, a layer of nitrided silicon dioxide, a layer of silicon oxynitride and/or a stack of layers of silicon dioxide, silicon nitride and/or alumina.

The temperature of the heat treatment is advantageously between 1050° C. and 1200° C.

The duration of the heat treatment is preferably between 5 minutes and 2 hours.

In one embodiment, the heat treatment is carried out in an atmosphere of argon or of a mixture of argon and nitrogen.

Before the application of the heat treatment, a protective oxide layer may advantageously be formed on the semiconductor-on-insulator structure.

Another object concerns a semiconductor-on-insulator type structure fabricated by the method described above that has a charge to breakdown greater than or equal to 10 C/cm$^2$.

BRIEF DESCRIPTION OF THE DRAWINGS

Other features and advantages of the invention will emerge from the following detailed description with reference to the accompanying drawings in which:

FIGS. 1A to 1D illustrate diagrammatically the fabrication of the semiconductor-on-insulator structure by the SMART CUT® method;

FIG. 2 shows a secondary ion mass spectrometry (SIMS) profile of an SOI structure before a long heat treatment carried out during post-fracture finishing of the SOI;

FIG. 3 is a graph showing the value of the charge to breakdown as a function of the duration and the temperature of the heat treatment;

Figure 4:
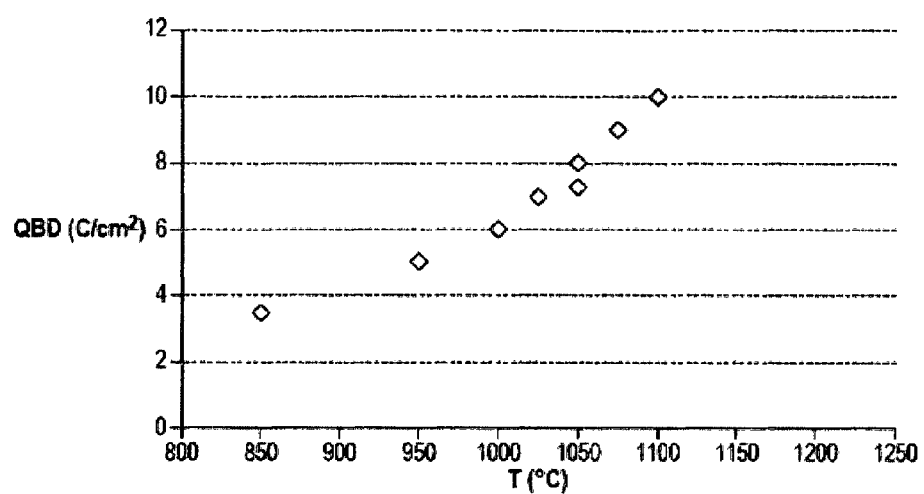
FIG. 4 is a graph showing the evolution of the charge to breakdown as a function of the heat treatment temperature for a fixed duration of two (2) hours.

To clarify the illustrations, the various layers are not represented here to their true scale.

DETAILED DESCRIPTION OF THE INVENTION

FIGS. 1A to 1D illustrate diagrammatically steps of the fabrication of a semiconductor-on-insulator structure based on the SMART CUT® method.

Referring to FIG. 1A, a donor substrate 1 is procured on which a dielectric layer 2 is formed.

The donor substrate 1 may be solid, i.e., constituted of a single semiconductor material, which is that of the semiconductor layer of the SeOI structure to be formed.

Alternatively, the donor substrate 1 may be a composite, i.e., constituted of a stack of at least two layers of different materials, one of which comprises, at its surface, a semiconductor material intended to form the semiconductor layer.

The material of the semiconductor layer is chosen from silicon (the structure then being referred to as Silicon-on-Insulator (SOI)), strained silicon (sSi) (the structure then being referred to as Strained Silicon-on-Insulator (sSOI)), silicon-germanium (SiGe), strained silicon-germanium (sSiGe), germanium, strained germanium, and semiconductor materials from groups III-V. The phrase "material from groups III-V" means an alloy of at least one element from group III and at least one element from group V of the periodic table of the elements.

The application of strain to the semiconductor material and/or an alloy with germanium enables the mobility of the carriers in the semiconductor layer to be increased.

The dielectric layer 2 may be formed by oxidation of the donor substrate 1 if the donor substrate 1 comprises silicon; the dielectric layer then comprises silicon dioxide ($SiO_2$).

The oxidation may consist of dry oxidation, wet oxidation and/or oxidation by the ISSG (In Situ Steam Generation) technique.

The dielectric layer 2, if it is in $SiO_2$, may equally result from the deposition of oxide by LPCVD, PECVD or any other deposition technique, such as that obtained with a TEOS type precursor, for example.

However, the material of the dielectric layer is not limited to $SiO_2$ but may comprise nitrided silicon dioxide (formed, for example, by plasma nitriding of thermal $SiO_2$, producing an $SiO_xN_y/SiO_2$ stack, the thickness and the stoichiometry of which depend on the applications), silicon oxynitride (with the general formula $SiO_xN_y$), or even a stack of layers of silicon dioxide, silicon nitride ($Si_3N_4$) and/or alumina ($Al_2O_3$).

For more details on silicon oxynitride, reference may be made to the paper "Propriétés optiques et électriques de couches minces d'oxynitrure de silicium déposées par pulvérisation cathodique r. f. réactive" by F. Rebib, PhD ["Optical and electrical properties of thin layers of silicon oxynitride deposited by reactive r.f. cathode sputtering"].

In this embodiment, the dielectric layer 2 is intended to constitute the buried dielectric layer in the finished SeOI structure.

In another embodiment (not shown here), the dielectric layer 2 may be formed entirely on the support substrate, the donor substrate 1 then being covered, if necessary, only with a layer of native oxide.

In another embodiment (not shown), a dielectric layer is formed on each of the donor and support substrates so that, after bonding of the substrates, the assembly of the two layers constitutes the buried dielectric layer.

For a fully depleted SeOI structure, the buried dielectric layer has a thickness between 3 nm and 50 nm, preferably between 10 nm and 30 nm.

Referring to FIG. 1B, atomic species are implanted in the donor substrate 1 through the dielectric layer 2.

The implantation dose and energy are chosen so that the implantation peak, i.e., the area in which most of the species are implanted in the donor substrate 1, is situated at a depth greater than or equal to the thickness of the semiconductor layer 12 to be transferred onto the support substrate.

During the determination of the implantation depth, account is taken of any finishing treatments that will be applied to the semiconductor layer 12 after fracture, for example, with a view to reducing its surface roughness, and which will be liable to reduce its thickness by consumption of material.

At the implantation depth there is formed an area of weakening 11 that delimits the semiconductor layer 12.

To this end, a single species (for example, hydrogen) may be implanted or a plurality of species (for example, helium and hydrogen) implanted simultaneously or successively.

As an alternative to implantation, the atomic species may be introduced into the donor substrate by diffusion from the surface of the donor substrate, for example.

Referring to FIG. 1C, the donor substrate 1 implanted in this way is bonded to a support substrate 3 so that the dielectric layer 2 is located at the bonding interface I.

The support substrate 3 may be solid or composite.

The support substrate 3 essentially acts as a stiffener for the semiconductor layer to be transferred.

The support substrate 3 may comprise at least one of the following materials: monocrystalline silicon, polycrystalline silicon, glass, quartz, and metal covered with polycrystalline silicon.

The bonding advantageously consists of molecular adhesion bonding.

Bonding is preferably preceded by a step of cleaning the surfaces of the donor substrate 1 and/or the support substrate 3 to be brought into contact, in order to remove any impurities present on the surface.

This cleaning step may also comprise activation of the surface of one or both substrates 1, 3 so as to increase the bonding energy.

Cleaning and activation techniques are well known to the person skilled in the art and will, therefore, not be described further in the present text.

Bonding is preferably followed by consolidation heat treatment aiming to increase the bonding energy between the two surfaces brought into contact.

Referring to FIG. 1D, the donor substrate 1 is fractured in the area 11 of weakening.

To this end, a mechanical, chemical and/or thermal force may be applied for starting and propagating a fracture front over all the surface of the area 11 of weakening.

After fracture, the SeOI structure formed is separated from the support substrate 3, the dielectric layer 2 and the semiconductor layer 12, on the one hand, and the remains of the donor substrate 1, on the other hand.

The remaining portion of the donor substrate 1 (not shown) may advantageously be recycled for later use.

The SeOI structure may be subjected to finishing treatments aiming to heal the semiconductor layer 12, which may have been damaged by implantation, reduce the roughness of the semiconductor layer 12 linked to fracture, etc.

Such treatments include, for example, RTA (Rapid Thermal Annealing) or RTP (Rapid Thermal Processing) treatments, which are heat treatments of short duration, i.e., having a duration of less than 2 minutes.

The finishing treatments may also comprise polishing treatments (for example, chemical-mechanical polishing (CMP)), etching, etc.

As a general rule, the treatments may lead to reduction of the thickness of the semiconductor layer 12.

In the final SeOI structure, obtained after any finishing treatments, the thickness of the semiconductor layer 12 may be between 1 nm and a few micrometers, preferably between 1 nm and 50 nm, and more preferably of the order of 12 nm.

In the example shown and described above, the fabrication method used is the SMART CUT® method, but it goes without saying that this method is not limiting on the invention and that, without departing from the scope of the present invention, another method could be chosen for fabrication of the semiconductor structure by bonding and transfer of the semiconductor layer onto a support substrate.

For example, the method could comprise bonding the unweakened donor substrate to the support substrate and then thinning the donor substrate until the required thickness of the semiconductor layer is obtained.

On the other hand, the SIMOX process, which involves no bonding but in which post-implantation annealing is effected at a temperature higher than 1250° C., is excluded from the scope of the present invention.

Because of the method of fabricating the SeOI structure, it is possible that hydrogen may have been trapped in the dielectric layer and/or in interface defects, the interface being located, depending on the bonding method chosen, between the dielectric layer and the support substrate or between the dielectric layer and the semiconductor layer, or inside the dielectric layer (in the case of dielectric/dielectric bonding).

Indeed, if hydrogen is implanted in the donor substrate through the dielectric layer, it is liable to damage the dielectric material through collisions between atoms.

Moreover, in so far as bonding is effected between the donor substrate and the support substrate, molecules of water may be trapped at the bonding interface.

Consequently, during heat treatments after bonding (such as consolidation heat treatment, RTA or RTP finishing treatment, etc.), hydrogen atoms (coming from some of the water molecules), on the one hand, diffuse into the dielectric layer 2 and, on the other hand, are trapped at the bonding interface I and in the dielectric layer 2.

These phenomena have been verified by SIMS measurements of the hydrogen concentration $C_H$ (expressed in atoms/cm$^3$) as a function of the depth p (expressed in nm) of the semiconductor-on-insulator structure.

FIG. 2 shows the SIMS profile of an SOI structure comprising a support substrate 3, a buried silicon dioxide (BOX) layer 2 having a thickness of 25 nm and a silicon layer 12 of 12.5 nm thickness.

SIMS measurement enables measurement of a high hydrogen surface density (expressed in atoms/cm$^2$) between $5 \times 10^{13}$ and $5 \times 10^{15}$ atoms/cm$^2$ and of the order of $5 \times 10^{14}$ atoms/cm$^2$ in the BOX layer 2.

In particular, the FIG. 2 curve exhibits a very sharp peak at the level of the bonding interface I, corresponding to a hydrogen concentration $C_H$ of the order of $5 \times 10^{20}$ atoms/cm$^3$.

The inventors have demonstrated a link between the charge to breakdown $Q_{BD}$ and the presence of hydrogen at the bonding interface and in the dielectric layer.

The charge to breakdown is a measurement reserved at present to checking gate oxides fabricated for MOS transistors by depositing oxide on an SOI structure and/or by thermal oxidation of the active layer of the SOI structure.

In contrast to the fabrication of the SOI structure which, as described above, involves a bonding step, the fabrication of a gate oxide does not involve any bonding.

For an MOS transistor, the charge to breakdown is representative of the reliability of the gate oxide.

This magnitude is typically measured by forcing the flow of current (or by injecting charge carriers) through the gate oxide at constant voltage.

To this end, capacitors are formed distributed at different locations of the SOI structure.

In a manner known in itself, the formation of a capacitor on an SOI structure typically comprises the deposition of a gate electrode on the active layer and the formation of trenches around the gate to isolate each capacitor from the rest of the structure. The trenches are, therefore, formed through the dielectric layer and into the support substrate.

An electrode is also formed on the rear face of the support substrate to force the flow of current through the dielectric layer.

Since measuring the charge to breakdown is electrically destructive, the measurement is carried out on a sample SOI structure taken from a fabrication batch.

The time at which the voltage falls (which corresponds to damage of the oxide) is recorded and, on the basis of the current at the time, it is possible to determine the total charge to breakdown of the oxide.

The charge to breakdown (expressed in C/cm$^2$) is defined by the equation:

$$Q_{BD}(T_{OX}, A_{OX}, T, V) = \frac{N_{BD}(T_{OX}, A_{OX})}{\xi(V, T)},$$

the critical defect density $N_{BD}$ being defined by the equation:

$$N_{BD}(T_{OX}, A_{OX}) = \frac{T_{OX}}{a_0^3} \exp\left(-\frac{a_0}{T_{OX}} \ln\left(\frac{A_{OX}}{a_0^2}\right)\right),$$

in which $A_{OX}$ is the area of the oxide (expressed in cm$^2$), $T_{OX}$ is the thickness of the oxide (expressed in nm), $\xi$ is the rate of generation of defects, which depends on the applied electric field (magnitude without units), V is the voltage at the terminals of the oxide and T is the time of breakdown.

The intensity of the current injected is typically between 100 and 300 mA/cm$^2$.

The inventors have measured the charge to breakdown $Q_{BD}$ of the semiconductor-on-insulator structure described above by applying it not to a gate oxide but to the buried dielectric layer 2.

In these tests, the size of the capacitor created on the SOI structure is considered to be $A_{OX}=6400$ μm$^2$ and $T_{OX}=25$ nm.

For an SOI structure comprising a silicon layer 12 nm thick and a buried oxide layer 25 nm thick, the inventors measured a charge to breakdown $Q_{BD}$ between 1 and 5 C/cm$^2$, typically of the order of 3 C/cm$^2$.

Such a value of $Q_{BD}$ is significantly less than that usually measured on a gate oxide.

Indeed, on a thermal oxide 25 nm thick constituting a gate oxide, the values of $Q_{BD}$ are of the order of 10 C/cm$^2$, and may be as high as 20 C/cm$^2$.

This difference may be explained by the fact that the fabrication of the SOI structure differs from that of a gate oxide, notably in that it involves a bonding step.

Publications have already produced hypotheses for explaining the degraded charge to breakdown $Q_{BD}$ for gate oxides.

In this regard, reference may be made to the papers by W. K. Meyer and D. L. Crook, Proc. Int. Reliability Physics Symposium, p. 242 (1983) and S. Holland, I. C. Chen, T. P. Ma and C. Hu, IEEE Electron Device Letters, 5, p. 302 (1984).

However, the oxide reliability problems discussed in those papers are specific to the formation of a gate oxide in the CMOS technology.

The inventors have moreover verified that the application to the SeOI structure of a long heat treatment having the effect of eliminating the hydrogen present at the bonding interface and in the dielectric layer enables the charge to breakdown $Q_{BD}$ of the dielectric layer to be significantly increased, up to a level comparable with that obtained for gate oxides.

Such long heat treatment may be applied after the steps of finishing the SOI structure (polishing, etching, etc.) but could equally be carried out after fracture and be followed by the finishing steps mentioned above.

In the present text, "long" means a treatment the duration of which is greater than or equal to 3 minutes, preferably greater than or equal to 5 minutes, as opposed to the RTA and RTP treatments, the duration of which is less than or equal to 2 minutes.

FIG. 3 is a graph showing the values of $Q_{BD}$ for the aforementioned capacitors as a function of the duration t (expressed in hours) and the temperature T of the heat treatment.

This graph shows that heat treatment at high temperature enables the value of $Q_{BD}$ to be increased, the dominant factor being the temperature of the heat treatment.

Indeed, even if the heat treatment lasts only about 5 minutes but is carried out at a temperature greater than 1100° C., the value of $Q_{BD}$ is increased by a factor of 3.

For example, for an SOI structure in which the silicon layer has a thickness of 12 nm and the oxide layer has a thickness of 25 nm, the final value of $Q_{BD}$ is of the order of 8 C/cm$^2$ for a treatment of 2 hours duration at 1050° C., of the order of 10 C/cm$^2$ for a treatment of 2 hours duration at 1100° C., and of the order of 11 C/cm$^2$ for a treatment of 1 hour duration at 1200° C.

In another example, for an SOI structure in which the silicon layer has a thickness of 12 nm and the dielectric layer a thickness of 10 nm, after heat treatment at 1200° C. for 5 minutes, a final value of $Q_{BD}$ is measured of up to 15 C/cm$^2$.

FIG. 4 is a graph showing the evolution of the charge to breakdown $Q_{BD}$ as a function of the heat treatment temperature, the duration of the treatment being equal to 2 hours.

Moreover, the fact of extending the length of the heat treatment does not contribute to increasing the value of $Q_{BD}$.

Given the foregoing, the heat treatment is advantageously applied to the SeOI structure at a temperature of between 1000° C. and 1250° C., preferably of the order of 1100° C., and for a duration of between 3 minutes and 100 hours, preferably between 5 minutes and 2 hours.

The heat treatment may be carried out in any appropriate device.

Thus, the heat treatment may be carried out in a furnace, for example, a furnace from the companies Tokyo Electron (TEL), ASM International or Hitachi Kokusai Electric.

Alternatively, the heat treatment may be carried out in an RTP device in which the heat treatment is extended beyond the usual duration of an RTP treatment.

The heat treatment atmosphere preferably comprises argon, either alone or mixed with nitrogen.

In one form of execution of the method, the SeOI structure is protected, either by encapsulation or by covering the surface of the semiconductor layer with a protective layer enabling prevention of dissolving of the oxide of the dielectric layer if the atmosphere consists of argon, or pitting of the semiconductor layer if the atmosphere contains nitrogen.

The protective layer is advantageously a layer of oxide formed by thermal oxidation or by deposition.

In this case, the heat treatment atmosphere has no particular function with regard to the treatment of the structure.

Consequently, an even slightly oxidizing atmosphere could be envisaged.

Figure 5:
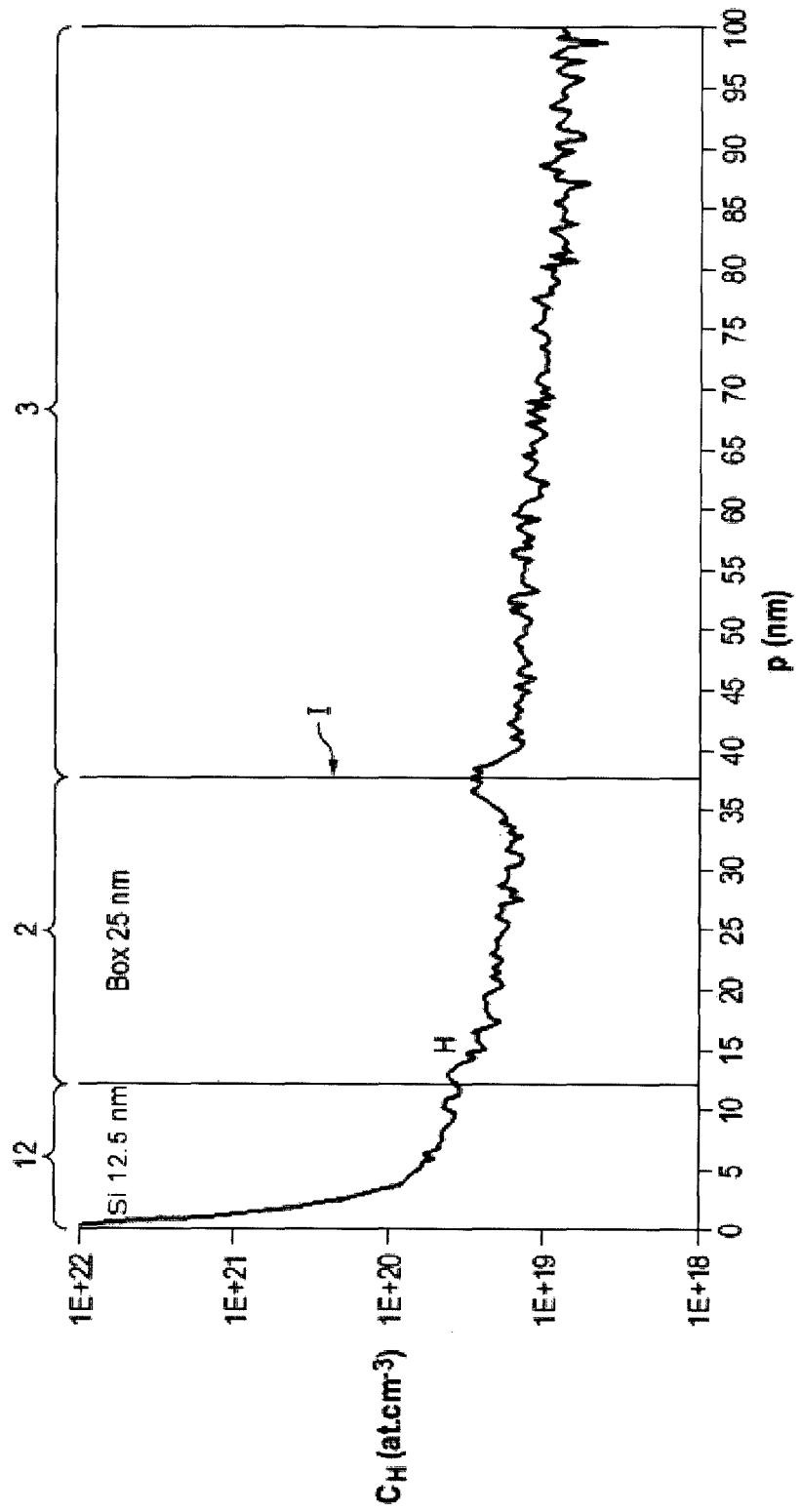
FIG. 5 shows the SIMS profile of a structure similar to that for which the SIMS profile is shown in FIG. 2 after application of the heat treatment.

FIG. 5 shows the SIMS profile of a structure similar to that for which the SIMS profile is shown in FIG. 2 after application of the long heat treatment.

Here, the heat treatment was applied at 1100° C. for 2 hours.

The value of $Q_{BD}$ measured after the heat treatment is 10 $C/cm^2$.

Moreover, the surface density of hydrogen is of the order of $5\times10^{13}$ atoms/$cm^2$, i.e., approximately 10 times lower than before the heat treatment (the value of $Q_{BD}$ measured before the heat treatment then being 3 $C/cm^2$).

It is also seen that the hydrogen concentration is much more homogeneous along the depth of the SOI structure.

In particular, no concentration peak is observed at the bonding interface I, which shows that the hydrogen that had been trapped in the interface defects and in the oxide layer has been eliminated thanks to a diffusion phenomenon.

The charge to breakdown may advantageously be measured on a semiconductor-on-insulator type structure before or after its heat treatment.

Thus, it enables a choice of the heat treatment conditions (temperature, duration) to be applied to achieve a given threshold for all of the wafers obtained from the fabrication method concerned following the heat treatment and the finishing process.

The threshold may vary according to the applications of the SeOI structure.

Thus, for Flash memories, a charge $Q_{BD}$ of the order of 10 $C/cm^2$ is desirable.

On the other hand, for other applications, the requirements may be lower and a charge $Q_{BD}$ of less than 10 $C/cm^2$, for example, 2 to 4 $C/cm^2$ may be sufficient.

To determine the parameters of the heat treatment, curves of the type shown in FIG. 4 are advantageously used.

Accordingly, if the charge $Q_{BD}$ measured after finishing the SeOI structure has a value of the order of 1 or 2 $C/cm^2$, heat treatment is carried out at a temperature preferably between 1150° C. and 1200° C. and/or for a duration of between 1 and 2 hours in order to achieve a final charge $Q_{BD}$ of 10 $C/cm^2$.

If on the other hand the charge $Q_{BD}$ measured after the finishing of the SeOI structure has a value of 4 or 5 $C/cm^2$, heat treatment is carried out at a temperature preferably between 1100° C. and 1150° C. and/or for a duration between 5 minutes and 1 hour in order to achieve a final charge $Q_{BD}$ of 10 $C/cm^2$.

The charge to breakdown may also be measured during fabrication of a batch of semiconductor-on-insulator type structures.

To this end, after the long heat treatment, a structure is sampled from the batch and its charge to breakdown measured in order to check that it indeed has the expected value.

If the charge $Q_{BD}$ has a value less than the expected value, this may mean that the parameters of the method are inappropriate and an analysis may be carried out to identify the reasons for the failure and to remedy it.

The invention claimed is:

1. A method of fabricating a semiconductor-on-insulator type structure comprising successively from its base to its surface a support substrate, a dielectric layer having a thickness of less than 50 nm and a semiconductor layer, the dielectric layer having a charge to breakdown ($Q_{BD}$) greater than or equal to a predetermined threshold, the method comprising:
    providing a first semiconductor-on-insulator type structure, comprising:
        procuring a donor substrate comprising a semiconductor layer;
        procuring a support substrate;
        forming a dielectric layer on a surface of the semiconductor layer of the donor substrate and/or on a surface of the support substrate;
        bonding the donor substrate to the support substrate, the dielectric layer being at a bonding interface;
        transferring the semiconductor layer from the donor substrate to the support substrate so as to form the semiconductor-on-insulator structure;
        measuring the charge to breakdown ($Q_{BD}$) of the dielectric layer and determining a temperature and a duration of a heat treatment sufficient to provide a charge to breakdown of the dielectric layer of greater than or equal to a predetermined threshold;
    providing at least a second semiconductor-on-insulator type structure at least substantially identical to the first semiconductor-on-insulator type structure;
    applying to the second semiconductor-on-insulator type structure a heat treatment at a temperature between 1000° C. and 1250° C. for a duration between 3 minutes and 100 hours and evacuating hydrogen atoms from the dielectric layer and/or the bonding interface and providing the dielectric layer of the second semiconductor-on-insulator type structure with a charge to breakdown of the dielectric layer of greater than or equal to the predetermined threshold.

2. The method of claim 1, wherein a thickness of the semiconductor layer is between 1 nm and 30 nm.

3. The method of claim 1, wherein a thickness of the dielectric layer is between 3 nm and 50 nm.

4. The method of claim 3, wherein the thickness of the dielectric layer is between 10 nm and 30 nm.

5. The method of claim 1, wherein a material of the semiconductor layer is selected from the group consisting of silicon, strained silicon (sSi), silicon-germanium (SiGe), strained silicon-germanium (sSiGe), germanium, strained germanium (sGe) and semiconductors from groups III-V.

6. The method of claim 1, wherein the dielectric layer comprises at least one of a layer of silicon dioxide, a layer of nitrided silicon dioxide, a layer of silicon oxynitride, and a stack of layers of silicon dioxide, silicon nitride and/or alumina.

7. The method of claim 1, wherein the temperature of the heat treatment is between 1050° C. and 1200° C.

8. The method of claim 1, wherein the duration of the heat treatment is between 5 minutes and 2 hours.

9. The method of claim 1, wherein the heat treatment is carried out in an atmosphere of argon or of a mixture of argon and nitrogen.

10. The method of claim 1, wherein, before the application of the heat treatment, a protective oxide layer is formed on the second semiconductor-on-insulator type structure.

11. The method of claim 1, wherein a thickness of the semiconductor layer is between 1 nm and 30 nm, and wherein a thickness of the dielectric layer is between 3 nm and 50 nm.

12. The method of claim 1, wherein the temperature of the heat treatment is between 1050° C. and 1200° C., and wherein the duration of the heat treatment is between 5 minutes and 2 hours, and wherein the heat treatment is carried out in an atmosphere of argon or of a mixture of argon and nitrogen.

13. The method of claim 12, wherein, before the application of the heat treatment, a protective oxide layer is formed on the second semiconductor-on-insulator type structure.

14. The method of claim 1, further comprising forming at least one capacitor on the first semiconductor-on-insulator structure configured for measuring the charge to breakdown, the formation of the at least one capacitor comprising deposition of a gate electrode on the semiconductor layer and formation of trenches through the dielectric layer around the gate electrode, and using the at least one capacitor to measure the charge to breakdown ($Q_{BD}$) of the dielectric layer and to determine the temperature and the duration of the heat treatment sufficient to provide a charge to breakdown of the dielectric layer of greater than or equal to the predetermined threshold.

15. A method of fabricating each of a batch of semiconductor-on-insulator type structures, each semiconductor-on-insulator type structure comprising successively from its base to its surface a support substrate, a dielectric layer having a thickness of less than 50 nm and a semiconductor layer, the method comprising:
procuring a donor substrate comprising the semiconductor layer;
forming the dielectric layer on the surface of the semiconductor layer of the donor substrate and/or on the surface of the support substrate;
bonding the donor substrate to the support substrate, the dielectric layer being at a bonding interface;
transferring the semiconductor layer from the donor substrate to the support substrate so as to form the semiconductor-on-insulator type structure;
applying to the semiconductor-on-insulator type structure a heat treatment at a temperature between 1000° C. and 1250° C. for a duration between 3 minutes and 100 hours to evacuate hydrogen atoms from the dielectric layer and/or from the bonding interface; and
sampling a semiconductor-on-insulator type structure from the batch and carrying out on the structure a test method comprising measuring the charge to breakdown ($O_{BD}$) of the dielectric layer and determining whether the charge to breakdown ($Q_{BD}$) of the dielectric layer is greater than or equal to a predetermined threshold.

16. The method of claim 15, wherein a thickness of the semiconductor layer is between 1 nm and 30 nm, and wherein a thickness of the dielectric layer is between 3 nm and 50 nm.

17. The method of claim 15, wherein the temperature of the heat treatment is between 1050° C. and 1200° C., and wherein the duration of the heat treatment is between 5 minutes and 2 hours, and wherein the heat treatment is carried out in an atmosphere of argon or of a mixture of argon and nitrogen.

18. The method of claim 17, wherein, before the application of the heat treatment, a protective oxide layer is formed on the semiconductor-on-insulator structure.

\* \* \* \* \*